United States Patent

Hakes

[15] 3,693,302

[45] Sept. 26, 1972

[54] ABRASIVE DICING OF SEMICONDUCTOR WAFERS

[72] Inventor: Glade L. Hakes, Scottsdale, Ariz.

[73] Assignee: Motorola, Inc., Franklin Park, Ill.

[22] Filed: Oct. 12, 1970

[21] Appl. No.: 79,929

[52] U.S. Cl. ........................................ 51/312

[51] Int. Cl. ........................................ B24c 1/04

[58] Field of Search ................ 51/310–312, 319–321, 51/262 R; 29/424, 577, 581

[56] References Cited

UNITED STATES PATENTS

| | | | |
|---|---|---|---|
| 3,473,941 | 10/1969 | Hemphill | 51/312 X |
| 2,666,008 | 1/1954 | Enslein | 51/312 X |
| 3,369,290 | 2/1968 | Mayer | 29/581 |
| 3,383,760 | 5/1968 | Shwartzman | 29/577 |
| 2,984,897 | 5/1961 | Godfrey | 29/424 |
| 2,799,789 | 7/1957 | Wolfskill | 51/312 |
| 3,579,926 | 5/1971 | Gaspari | 51/312 |

*Primary Examiner*—Donald G. Kelly
*Attorney*—Mueller and Aichele

[57] ABSTRACT

A heat curable plastisol is used for forming an easily applied, abrasion resistant and acid etch resistant mask to a semiconductor wafer, preliminary to dicing, for protecting a supporting substrate, and for attaching the semiconductor wafer to the protected substrate.

4 Claims, 6 Drawing Figures

INVENTOR.
Glade L. Hakes
BY
Mueller & Aichele
ATTY'S

ABRASIVE DICING OF SEMICONDUCTOR WAFERS

BACKGROUND OF THE INVENTION

This invention relates to methods of forming, e.g., dicing, semiconductor chips from a semiconductor wafer, more particularly to improvements in such methods whereby substantially greater yields in the number of chips per wafer are obtained.

The high cost of labor and materials creates the need for efficiency and economy in the manufacture of semiconductor materials and devices such as chips. Chips may be formed by dicing, or cutting, a much larger wafer. Scribing and breaking, and etching are two known methods for carrying out such dicing. In the scribing and breaking method a substantial number of chips are rendered useless because jagged breaks ruin the junction or reduce the useful surface area. In the chemical etch method the wafer is attached to a supporting substrate and a mask is used to define the extent of the individual chips, but to arrive at a chip of the desired area, a much larger area must be masked because of the undercutting effect of the etch. In either case the ultimate yield of chips is substantially less than that possible.

While abrasive dicing offered another approach to the problem, the need for a suitable mask against abrasion, and the need for an adhesive for attaching the wafer to a supporting substrate did not suggest that this approach was a good one. Moreover, abrasion creates damage to the semiconductor surface requiring correction as by a chemical etch. The latter, of course, requires a further masking step with attendant increased costs. In addition, since the wafer had to be cut through, some form of protective layer for the supporting substrate was needed.

Accordingly, it is a further object of the invention to provide a method of for dicing wafers into semiconductor chips which utilizes the same mask for dicing as for chemical etch cleaning and uses the same masking material as an adhesive for attaching the wafer to the supporting substrate.

It is a further object of the invention, in making semiconductor chips from a wafer, to utilize the same material for protecting the supporting substrate, for adhering the wafer to the protected substrate, and as a combined mask for abrasive blast dicing and chemical etch cleaning.

It has been found that, by using the inventive techniques a typical wafer will yield 421 dice or chips of a particular diameter as compared to 265 by the chemical etching method. In another instance, the same wafer will yield 48 dice or chips of much larger area, using the invention, as compared to 31 by the chemical etching method.

DESCRIPTION OF THE PRIOR ART

The U.S. Pat. to Clark, No. 3,260,634 relates to chemical etch dicing of semiconductor wafers. The U.S. Pats. to Hathaway, No. 2,599,710, Richardson, No. 3,179,729, Little et al., No. 3,184,823, Barbaro, No. 3,209,428, Weisberg, No. 3,288,662, Shwartzman, 3,383,760, Mayer et al., No. 3,369,290 disclose some form of sand blasting in various environments, and the U.S. Pat. to Godfrey, No. 2,984,897 discloses an adhesive for attaching a semiconductor wafer to a supporting substrate.

In this prior art there is no teaching of a single mask for abrasive dicing and chemical etch cleaning and of the same masking material as an adhesive. It is a further object of the invention to overcome, in an economical and efficient way, the shortcomings of the prior art.

SUMMARY OF THE INVENTION

In carrying out the invention in one form, a method for forming semiconductor chips is provided comprising the steps of:

masking one surface of a semiconductor wafer in a predetermined pattern with an abrasive blast and chemical etch resistant material, exposing said masked surface to an abrasive blast until the unmasked portions of said wafer are abraded through and removing the masking from the remaining portions of said semiconductor.

In carrying out the invention according to another form, improvements in forming semiconductor chips by abrasive blast dicing from a wafer attached to a substrate are provided comprising the use of a heat curable plastisol, or elastomer, for protecting the substrate, for adhering the wafer to the protected substrate and as a combined mask for abrasive blast dicing and chemical etch cleaning.

DESCRIPTION OF THE PREFERRED EMBODIMENT

Figure 4:
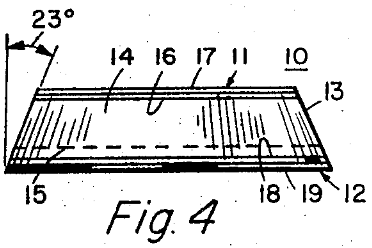
FIG. 4 is an elevational view, partially diagrammatic, and on a larger scale, of the finished chip.

Referring more particularly to the drawings, a finished die or chip 10 made according to the invention is shown in FIG. 4. The chip is essentially in the shape of a frustrum of a cone having parallel top bottom surfaces 11 and 12 which are parallel to each other and a side or slant surface 13 which is at an angle of about 23° to the vertical. The angle of 23°, as shown, is typical of chips cut from a wafer by the abrasive blast method according to the invention. Angles of the order of 20° to 30° are common. Typically, the chip 10 includes a semiconductor body 14 of silicon, for example, having a PN junction 15 adjacent the surface 12 and one or more layers of nickel and gold 16 and 17, respectively, at the surface 11 and 18 and 19, respectively, at the surface 12.

The chip or die 10 is formed from a larger wafer 21 of silicon, for example, and is shown in the figures as a single layer, it being understood that the wafer 21 includes metallic layers desired on each of its parallel surfaces.

Figure 1:
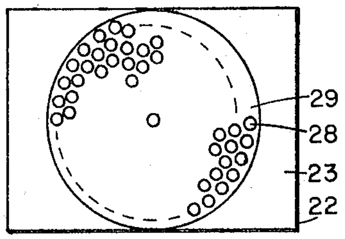
FIG. 1 is a plan view of a masked wafer and substrate according to the invention.

A ceramic supporting substrate 22 is provided, a film 23 of a plastisol is applied to substrate 22 and is cured, a second film 24 of the same plastisol is applied to the cured surface 23 and the wafer 21 is placed over top the film 24 and the combination is again cured. Thereafter, a mask is disposed over the wafer 21, a portion of uncured plastisol 26 (FIG. 6) is squeezed through the interstices of the mask as by a wiper 27, and the mask is removed leaving a number of small dabs or mounds 28 of uncured plastisol on the surface of wafer 21. The mounds 28 are cured, thereby providing a semiconductor wafer 21 attached to substrate 22 with cured mounds 28 attached to the upper surface of the wafer 21. Between the dabs or mounds 28 of cured plastisol there are portions 29 (FIGS. 1 and 2) of the semiconductor wafer 21 which are not masked but rather are exposed.

Figure 2:
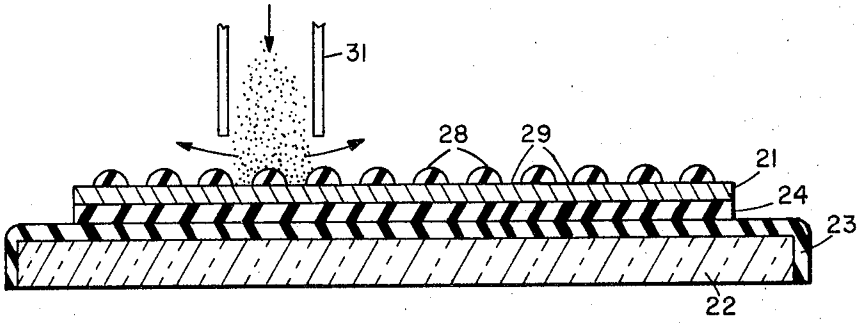
FIG. 2 is a sectional view, on a larger scale, of the article shown in FIG. 1 at a later stage of the inventive method.

In FIG. 2 the masked and cured combination is shown underneath a nozzle 31 through which a blast of relatively high pressure air containing a fine sand is blown at the surface of the wafer 21 with the cured mounds 28 thereon. The nozzle 31 may be played back and forth across the surface of the semiconductor or the semiconductor wafer may be moved underneath the end of the nozzle as desired. In any event, the blast of air and sand abrades away the material of the semiconductor wafer 21 which is exposed, that is the exposed material 29 including any metallic layers and the semiconductor material itself. The exposed material 29 is abraded away until the semiconductor wafer 21 including the metallic layers on the top and bottom sides are completely cut through to the cured layer 24 of the plastisol. This is shown in FIG. 3.

The cured mounds 28 or dabs of the plastisol act as a mask against the abrasive sand blast thereby protecting the semiconductor material underneath the mounds. In between the mounds, however, the sand blast abrades away the semiconductor surface leaving angular sides 13 of the semiconductor dice or chips. The sides 13 taper toward each other as may be seen in FIG. 3 which is a natural result of utilizing a sand blast because the particles of sand or other abrasive, tend to be reflected from the sides of the wafer as the abrasive process takes place. By visual inspection, the application of the sand blast may be stopped when it appears that the exposed portions 29 of the wafer semiconductor 21 are completely abraded away and the surface of the cured plastisol 24 is visible as may be visualized in FIG. 3. The substrate 22 is protected inasmuch as the layers 23 and 24 of cured plastisol prevent the sand blast from cutting through to the ceramic surface.

After the abrasive blast dicing or cutting is complete, the assembly including the diced wafer is placed into an etching solution of nitric, hydrofluoric acid. The cured plastisol 28 and 24 and 23 will withstand the action of the etch, but the slant surfaces 13 of the dice or chips 10 will be cleaned and polished by the action of the etch to improve the surface, as is well understood. Thereafter, the diced wafer assembly is immersed in rinsing water and a solvent is applied to soften the cured plastisol mounds 28 and layer 24 so that the dice or chips 10 can be and are removed for utilization in rectifiers or other semiconductor devices.

Figure 3:
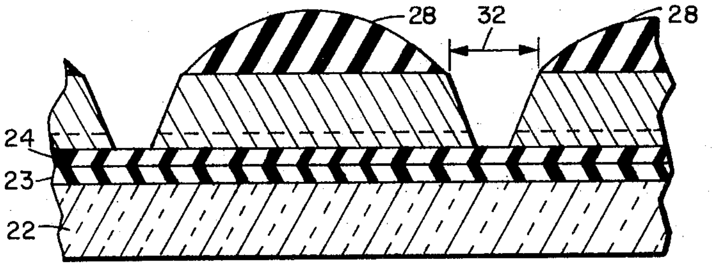
FIG. 3 is a sectional view, on a still larger scale, of the article of FIG. 1 at a still later stage of the inventive method.

Typical diameters of the dabs or mounds 28 or plastisol may be 0.045 inches and the mounds may be separated from each other by a distance typified by the reference character 32 in FIG. 3 which dimension may be of the order of 0.012 inches. These dimensions, following the teachings of the invention, will result, typically, in the lower surface 12 of the semiconductor chip having a diameter of about 0.054 inches.

It is evident that the mounds 28 of cured plastisol are small and consequently the mask by means of which the mounds are formed must be small and precise. Moreover, the plastisol material out of which the mounds 28 are formed must have desirable properties such that it may be squeezed through the interstices or openings in a mask, will leave a precisely shaped mound of material on the surface of the semiconductor wafer 21 when the mask is removed and will retain that same shape during the curing process in order that the chips will have the desired dimensions when the process is complete.

The mask formed by the total of the mounds or dabs 28 is readily formed by the plastisol compounds particularly finely divided polyvinyl chloride dispersions in a plasticizer. These compounds take many forms but may in the uncured, or room temperature form, be essentially liquid although composed almost totally of finely divided plastic solids.

The plastic and plasticizer are chosen to be immiscible at room temperatures but to be mutually soluble at elevated temperatures. Therefore, the material changes from a concentrated suspension of high viscosity to a highly plasticized elastomeric semi-solid at the temperature of mutual solubility.

The properties of the plastic include moderate adhesion to silicon oxide surface; gold surface of the wafer and some adhesion to the ceramic carrier; very good abrasion resistance; moderate resistance to attack by acids; viscosity controllable to allow silk screening; and simple removal from dice and of dice from the ceramic carrier.

These properties are met by a variety of materials including suitably plasticized polyvinylchloride deposited from plastisols as described.

Cure of the plastisol can be attached without polymerization of the resin or cross-linking reactions. Thus adhesion only involves physical adsorption and mechanical interactions. Abrasion resistance is very good because the highly plasticized polymer has sufficient elongation to absorb the energy of the particles without rupture. The carbon back-bone of the polymer imparts sufficient resistance to acids and the viscosity can be controlled over wide ranges by the choice of plastic particle size, plasticizer, lubricants, etc. Solvent-nonsolvent mixtures can be chosen which swell—but do not dissolve—the resin to facilitate its removal.

One polyvinyl chloride dispersion, plastisol, sold under the trade name of Chem-O-Sol by Chemical Products Corporation, King Philip Road, East Providence, Rhode Island and identified by the indicia PK6422 has been found completely satisfactory. This substance is a smooth paste-like material at room temperature which spreads readily and thus lends itself to pushing through a mask as by wiper 27. It has good dimensional stability at room temperatures in that the essentially liquid mask stays in whatever form it is placed in until caused to change that form. Thus, when squeezed through a mask, as for example a silk screen, and the mask is removed, the globules of material remaining retain their initial shape. The substance when cured, as by a short exposure to temperatures in the vicinity of 325° to 375°F for periods of approximating 5 minutes in the case of thin layers, changes to a relatively firm rubber-like material, or elastomer, which resists abrasion, acids and the like. The particular polyvinyl chloride dispersion, plastisol, referred to, hardens to a durometer value of about 60 although values between 40 and 80 have been used with good results. The cured rubber-like material resists the abrasion of a sand blast and the action of nitric, hydrofluoric acid used as an etchant in the subject invention.

While in the particular form, the polyvinyl chloride dispersion is squeezed through a mask, some forms of these substances could be sprayed through a mask and still have sufficient dimensional stability to retain the shape determined by the mask through the curing process following which the abrasive blast and acid etching steps would be applied.

Figure 5:
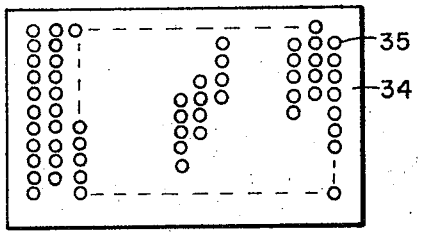
FIG. 5 is a plan view of one portion of the mask used during the inventive method.
Figure 6:
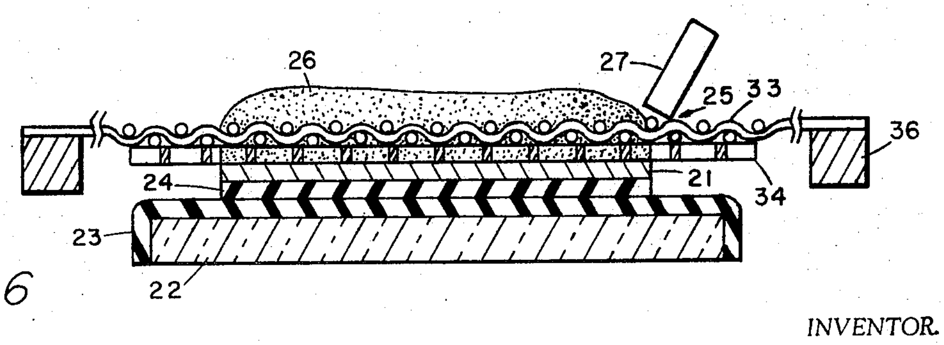
FIG. 6 is a sectional view illustrating, on a larger scale, and partially diagrammatic, one part of the inventive method.

Referring to FIG. 6, the mask 25 through which the past polyvinyl chloride dispersion is pushed is a two-part mask consisting of a fine mesh stainless steel screen 33 (sometimes called a silk screen) and a stainless steel mask member 34 attached to each other by any suitable means such for example as an adhesive sold under the name of Eastman 910, manufactured by the Eastman Kodak Company of Rochester, New York. The mask member 34 may be a piece of stainless steel about eight-thousandths of an inch thick and perforated with holes of the same size as the diameter of the dabs or mounds 28, a typical mask being diagrammatically shown in FIG. 5. Of necessity, the mask member 34 needs to be thin because the mounds of material 28 are of about the same thickness as that of the wafer which, in a typical case, may be about eight-thousandths of an inch. The total height of the mounds 28 is determined by the thickness of the mask member 34 and the space between the bottom surface of the screen 33 and its top surface at which surface the mass of plastisol 26 terminates by virtue of having been squeezed thereto by wiper 27.

The screen wire 33 may be one having a mesh size between 100 and 300, 145 mesh being typical. The screen wire itself is attached to the mask member 34 by the indicated adhesive at each point possible, because of the thinness of the mask member, but so as not to block any of the openings through the screen wire and the openings 35 of the mask member.

The interstices of the screen wire being smaller than those of the openings 35, the bulk of plastisol 26 is effectively broken up, or divided. Thus, when the screen wire 33 is lifted off, after the desired amount of material 26 has been squeezed through it by wiper 27, the plastisol dabs or mounds left by the openings 35 in mask member 34 are of the diameter and height desired. That is, the screen openings break up the bulk of the plastisol material so that the mask 25 may be lifted off without taking the dabs or mounds of material with it.

The screen wire 33 is attached at its edges to a frame 36 and is stretched tightly thereto being held at its ends to frame 36 by the same adhesive, Eastman 910. After the mounds of plastisol 28 are formed as described, the assembly is placed into an oven and a curing temperature of about 325°F is applied for about 5 minutes, following which the mounds 28 assume a relatively soft rubber-like nature (elastomer) which will resist the abrasion of a sand blast as well as that of an acid etch.

Other materials for the mask member 34 than stainless steel may be used, for example, the metal substance sold under the well known name of Kovar.

The ceramic substrate 22 may be of any relatively smooth ceramic material such as porcelain or glass. The film 23 of the plastisol PK6422 is applied to one surface of the substrate and may have a thickness of about one ten-thousandth of an inch. The substrate 22 with the film of uncured plastisol 23 applied is then cured for a period of about 5 minutes at the temperature of 325°F. The plastisol film 23 then is a rubbery elastomeric substance, quite tough and resistant to abrasion and acids. Thereafter, a second film layer 24 of plastisol is applied and the wafer 21 of semiconductor material is placed thereon and pushed tightly there against following which the same curing cycle is followed. The wafer 21 then adheres very tightly to the substrate. That is, the uncured film of plastisol 24, when cured, adheres not only to the cured film 23 but also to the semiconductor wafer throughout all subsequent processing as described.

The abrasive particles used may be of the order of 1 mil in diameter and may be, for example, of sand. The inside diameter of the nozzle 31 may be of the order of one-quarter of an inch or enough to cover a span of about three mounds 28. The air pressure used may vary depending upon the speed of cutting desired but typically the pressure may be about 90 pounds per square inch.

Following removal of the mask 33 from the semiconductor wafer 21 as seen in FIG. 6, the wafer with the uncured dabs of plastisol 28 may be subjected to a light vacuum treatment in order to remove any small pockets of air which may be occluded in the bulk of the mounds 28. Thereafter, when the mounds 28 are cured, as described, they have a continuous and an uninterrupted surface which resists abrasion and acid etch.

The cured mounds of plastisol 28 mask portions of wafer 21 against the abrasion of the sand blast as well as the effect of an acid etch. The cured layers 24 and 23 protect the substrate 22 from the action of sand blast and acid during the course of these processes. Accordingly, the substrate 28 is useable over and over again.

With the clean and sharp sides 13 produced by the sand blast cutting, there is a more efficient use of the wafer and therefore an increased number of dice or chips per wafer is obtained. The amount of semiconductor material that must be allowed for removal to obtain completed dice of the appropriate dimensions is thus reduced with corresponding increase in yield.

The plastisol described is thermo plastic in the sense that at higher temperatures it becomes softer even though cured. The material is also referred to as fusing in the change from the "liquid" or uncured state into the solid or cured state.

While the application of the plastisol material to the semiconductor wafer has been described as by squeezing through a mask or by spraying, it is feasible to sensitize the material and use photoresist masking techniques.

The forward voltage drop in rectifiers, for example, of silicon semiconductor is reduced because of the increased area of the silicon chip available by the process, according to the invention, as compared with the chemical etching technique. Physical strength is increased because of the increased area available for soldering the chip to contacts.

Solutions used for softening the mounds of masking material as well as the layers 23 and 24 on the substrate after the dice have been completely etched and separated are solvents such as acetone or trichlorethylene. These substances soften the polyvinyl chloride layers so that they can be stripped off easily.

While one form of the invention has been disclosed, it will be understood that others may be conceived within the scope of the disclosure.

What is claimed is:

1. A method for forming semiconductor chips comprising the steps of:

providing a wafer of semiconductor material, adhesively attaching said wafer at one of its sides to a supporting substrate, forming a series of closely spaced abrasion and chemical etch resistant dabs of masking material on the exposed side of said wafer, exposing said wafer and dabs to an air blast containing abrasive until the portions of said wafer between said masking dabs are abraded through, removing said dabs of masking material, and removing said chips from said substrate.

2. The method according to claim 1 wherein said abrasive blast and chemical etch resistant material comprises a synthetic thermo curing compound.

3. The invention according to claim 1 wherein said blast and etch resistant material comprises polyvinyl chloride dispersion.

4. The method of claim 1 wherein the forming comprises utilizing a two-layered mask, one layer being of fine screen wire and the other being of the desired pattern, the two layers being firmly adhered to each other.

* * * * *